United States Patent [19]

Fenner et al.

[11] Patent Number: 4,717,851

[45] Date of Patent: Jan. 5, 1988

[54] ADAPTATION LAYER FOR AN ULTRASOUND APPLICATOR

[75] Inventors: Ernst Fenner, Erlangen; Martina Vogt, Fuerth, both of Fed. Rep. of Germany

[73] Assignee: Siemens Aktiengesellschaft, Berlin and Munich, Fed. Rep. of Germany

[21] Appl. No.: 906,045

[22] Filed: Sep. 11, 1986

[30] Foreign Application Priority Data

Apr. 30, 1986 [DE] Fed. Rep. of Germany ... 8611844[U]

[51] Int. Cl.[4] ..... H01L 41/08

[52] U.S. Cl. ..... 310/334; 73/644; 310/327; 310/336; 367/152; 29/25.35

[58] Field of Search ..... 310/334–337, 310/327, 357, 358; 367/150–152; 73/644

[56] References Cited

U.S. PATENT DOCUMENTS

| | | | |
|---|---|---|---|
| 2,875,354 | 2/1959 | Harris | 310/358 |
| 3,070,775 | 12/1962 | Andrews, Jr. | 310/357 X |
| 4,081,889 | 4/1978 | Levine | 310/327 X |
| 4,184,094 | 1/1980 | Kopel | 310/335 |
| 4,211,948 | 7/1980 | Smith et al. | 310/322 |
| 4,297,607 | 10/1981 | Lynnworth et al. | 310/334 |
| 4,330,593 | 5/1982 | Shrout et al. | 310/358 X |
| 4,383,194 | 5/1983 | Ohigashi et al. | 310/321 X |
| 4,443,730 | 4/1984 | Kitamura | 310/358 X |
| 4,523,122 | 6/1985 | Tone et al. . | |
| 4,595,515 | 6/1986 | Wakino et al. | 310/327 X |

FOREIGN PATENT DOCUMENTS

| | | | |
|---|---|---|---|
| 3430161 | 2/1986 | Fed. Rep. of Germany . | |
| 0105799 | 8/1979 | Japan | 310/357 |
| 0120899 | 9/1979 | Japan | 310/357 |
| 0120900 | 9/1979 | Japan | 310/357 |

*Primary Examiner*—Mark O. Budd

*Attorney, Agent, or Firm*—Lawrence C. Edelman

[57] ABSTRACT

An adaptation layer for an ultrasound applicator which contains a mixture of synthetic resin and ceramic powder. Through the addition of ceramic powder, the acoustic impedance of the applicator can be easily adjusted. Impedance values selectable in the range of e.g., 6 to $12\times10^6$ kg/m$^2$sec are possible.

20 Claims, 2 Drawing Figures

ADAPTATION LAYER FOR AN ULTRASOUND APPLICATOR

BACKGROUND OF THE INVENTION

1. Field of the Invention

The invention relates to an adaptation layer for an ultrasound applicator which is provided for matching of the acoustic impedance of an ultrasound source to the acoustic impedance of the body of a patient.

2. Description of the Prior Art

Ultrasound applicators of this kind are widely used in medical technology to obtain information about the inner structures of tissues and organs in a patient. One problem is how to introduce the ultrasonic waves into the patient.

The piezoelectric transducer(s) of medical ultrasound applicators often comprise a material having a relatively high acoustic impedance. Materials such as ceramics of lead-zirconate-titanate have e.g., an acoustic impedance of about $30\times10^6$ kg/m$^2$ sec. On the other hand, the skin and tissue of the patient only have an acoustic impedance of about $1.5\times10^6$ kg/m$^2$ sec. To avoid to a large extent undesirable reflection at the interface between the piezoelectric transducer and the human tissue, an adaptation (or impedance-matching) layer is disposed between the transducer and the tissue.

The acoustic impedance of this adaptation layer depends on the impedance of the piezo-ceramic used as the transducer element. Therefore, the impedance should be freely selectable or adjustable within certain limits and include a range that extends from about 6 to $12\times10^6$ kg/m$^2$ sec. With natural occurring materials such an acoustic impedance is difficult to attain. For example, gases and liquids are in the range from 0 to $4\times10^6$ kg/m$^2$ sec. There are but a few substances with values above the last-named value, that is, there are practically no materials with the favorable matching impedance of about $8\times10^6$ kg/m$^2$ sec. The acoustic values of minerals, metals, etc. range between 14 and about $100\times10^6$ kg/m$^2$ sec. The range desired herein of about $8\times10^6$ kg/m$^2$ sec can only be reached with great difficulty by means of glass compounds.

SUMMARY OF THE INVENTION

It is an object of the invention to provide an adaptation layer for an ultrasound applicator which has an acoustic impedance which is easy to adjust during manufacture, and whose mechanical properties permit relatively easy fabrication.

In accordance with the invention the adaptation layer contains a mixture of synthetic resin and ceramic powder. As a rule it may consist entirely of this mixture.

An advantage of this type of adaptation layer is that by adjustment of the proportion of its ceramic powder content, its acoustic impedance is easily adjustable. As a rule, a ceramic powder content between 50% and 90% by weight is sufficient to obtain the acoustic impedances desired in the medical field. The finished, injection-molded or cast adaptation layer is easy to fabricate by machine. It can readily be turned on a lathe, milled, glued, cut and polished or ground.

Other features and advantages of the invention will be apparent from the following description of the preferred embodiments, and from the claims.

For a fuller understanding of the present invention, reference should now be made to the detailed description of preferred embodiments of the invention and to the accompanying drawings.

DETAILED DESCRIPTION OF THE PREFERRED EMBODIMENTS

Figure 1:
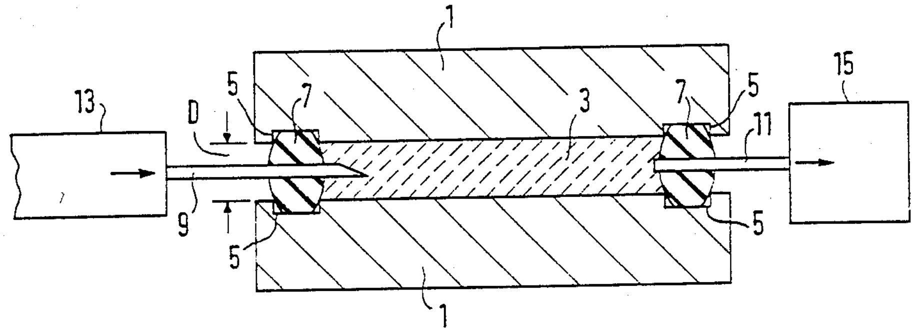
FIG. 1 illustrates the manufacturing of an adaptation layer in accordance with the invention which comprises a mixture of synthetic resin and ceramic powder.

In FIG. 1, two rectangular metal plates 1 together form a gap 3. Along the edges of each of plates 1 there extends a rectangular groove 5 having a U-shaped cross section. A rubber ring 7 is inserted into opposing grooves 5. Consequently, gap 3 is limited by metal plates 1 and rubber rings 7. The thickness D of gap 3 can be varied by pressing metal plates 1 together. Thickness D is adjusted to be between 70 μm and 1000 μm in accordance with the desired thickness of the ultrasound adaptation layer. Rubber rings 7 are pierced by opposing cannulas 9 and 11. One end of each of cannulas 9 and 11 extend inside gap 3. The outside end of cannula 9 is connected to an injection device 13, and the outside end of cannula 11 is connected to a vacuum pump 15.

A synthetic resin, e.g., an epoxy resin, is brought to a temperature at which a pulverized ceramic material to be filled in does not set. The setting is determined by the viscosity of the resin existing at the given temperature. When using an epoxy resin, for example, the resin temperature should be 373° K.±5° K.

A ceramic powder, after having been predried in a stove at about 473° K. to free it from water, is stirred into the resin at, for example, a temperature of 373° K. The ceramic powder preferrably has a grain size in the range of a few microns, e.g., 5 μm or less.

The ceramic powder is also preferably a piezoceramic powder, such as a lead-zirconatetitanate.

After the predried ceramic powder has been mixed with the cast resin which was brought to the given temperature, the mixture is stored at 373° K. for about one hour. Then it is mixed again.

After about two hours of preheating at approximately 363° K., a hardener is stirred into the mixture. The mixture is also subjected to a vacuum in order to expel any air bubbles it may have. Thereafter, injection device 13 is preheated and the mixture is poured into preheated injection device 13.

Metal plates 1 are also preheated to 363° K. The thickness of metal plates 1 is designed so that their heat capacity is sufficient to prevent any substantial cooling inside gap 3 during the injection process. In the preferred embodiment, metal plates 1 are made of hardened steel having a thickness of about 20 mm.

Next, vacuum pump 15 and injection device 13 are simultaneously turned on. The preheated resin/ceramic powder mixture is injected into gap 3 until the mixture has advanced up to cannula 11. Then, vacuum pump 15 is turned off and injection device 13 is operated a little longer in order that the mixture in gap 3 is brought to a slightly positive pressure.

Next, cannulas 9 and 11 are severed or, if rubber rings 7 are self-sealing, merely pulled out. Metal plates 1 are then placed in a stove for hardening of the mixture for two hours at 363° K. After metal plates 1 are removed, the hardened mixture present in gap 3 is allowed to complete its hardening process for about seven hours.

Thus the hardened mixture forms an adaptation layer whose acoustic impedance is easily adjustable through its proportion of ceramic powder. At the same time, the advantage is obtained that an adaptation layer is easy to fabricate from the hardened mixture by further machining.

Figure 2:
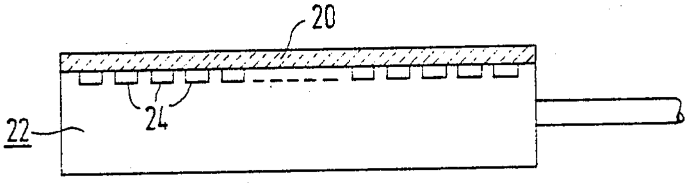
FIG. 2 illustrates an ultrasound application including the adaptation layer of FIG. 1 applied thereto.

FIG. 2 schematically shows an ultrasound applicator 22 of the type used in the medical field arranged for the ultrasonic scanning of patients. Applicator 22 contains a plurality of ultrasonic transducer elements 24 arranged in parallel alignment. Transducers 24 are covered on their emission side by an adaptation layer 20 fabricated from the hardened resin/ceramic powdered mixture formed as described in FIG. 1.

Thus, there has been shown and described a novel adaption layer for an ultrasound applicator which fulfills all the objects and advantages sought therefore. Many changes, modifications, variations and other uses and applications of the subject invention will, however, become apparent to those skilled in the art after considering this specification and the accompanying drawings which disclose a preferred embodiment thereof. All such changes, modifications, variations and other uses and applications which do not depart from the spirit and scope of the invention are deemed to be covered by the invention which is limited only by the claims which follow.

What is claimed is:

1. In an ultrasound signal applicator, an adaptation layer is provided for the adaptation of the acoustic impedance of an ultrasound signal source to the acoustic impedance of a body to be scanned by use of said applicator, said acoustic impedance of said body being significantly lower than said acoustic impedance of said ultrasound signal source and said acoustic impedance of said adaptation layer being in the range between said acoustic impedance of said signal source and said body, wherein said improvement comprises:

said adaptation layer comprising a mixture of a synthetic resin and a ceramic powder.

2. The applicator of claim 1, wherein:

said ceramic powder comprises a piezo-ceramic powder.

3. The applicator of claim 2, wherein:

said piezo-ceramic powder of said adaptation layer is a lead-zirconate-titanate powder.

4. The applicator of claim 1, wherein:

said ceramic powder of said adaptation layer consists of grains smaller than 5 μm.

5. The applicator of claim 1, wherein:

the thickness of said adaptation layer is between 70 and 1000 μm.

6. The applicator of claim 1, wherein:

the acoustic impedance of said adaptation layer is in the range of from 6 to $12\times10^6$ kg/m$^2$ sec.

7. The applicator of claim 1, wherein:

said ceramic powder of said adaptation layer comprises 50%-90% by weight of said mixture.

8. The applicator of claim 1, wherein:

said adaptation layer is applied onto an ultrasonic applicator including a plurality of ultrasonic transducer elements.

9. The applicator of claim 3, wherein:

said ceramic powder of said adaptation layer consists of grains smaller than 5 μm.

10. The applicator of claim 4, wherein:

thickness of said adaptation layer is between 70 and 1000 μm.

11. The applicator of claim 5, wherein:

the acoustic impedance of said adaptation layer is in the range of from 6 to $12\times10^6$ kg/m$^2$ sec.

12. The applicator of claim 6, wherein:

said ceramic powder of said adaptation layer comprises 50%-90% by weight of said mixture.

13. The adaptation layer of claim 7, wherein:

said adaptation layer is applied onto an ultrasonic applicator including a plurality of ultrasonic transducer elements.

14. An ultrasonic signal applicator, comprising:

a piezo-ceramic ultrasonic signal source having a given acoustic impedance; and an adaptation layer coupled to said ultrasonic signal source for matching said given acoustic impedance of said ultrasonic signal source to a significantly lower acoustic impedance of a body to be scanned by use of said applicator, said adaptation layer comprising a mixture of a synthetic resin and a ceramic powder.

15. The applicator of claim 14, wherein:

said ceramic powder of said adaptation layer comprises a piezo-ceramic powder.

16. The applicator of claim 15, wherein:

said piezo-ceramic powder of said adaptation layer is a lead-zirconate-titanate powder.

17. The applicator of claim 14, wherein:

said ceramic powder of said adaptation layer consists of grains smaller than 5 μm.

18. The applicator of claim 14, wherein:

the thickness of said adaptation layer is between 70 and 1000 μm.

19. The applicator of claim 14, wherein:

the acoustic impedance of said adaptation layer is in the range of from 6 to $12\times10^6$ kg/m$^2$ sec.

20. The applicator of claim 14, wherein:

said ceramic powder of said adaptation layer comprises 50%-90% by weight of said mixture.

* * * * *